United States Patent [19]

Otsubo et al.

[11] Patent Number: 4,776,918

[45] Date of Patent: Oct. 11, 1988

[54] PLASMA PROCESSING APPARATUS

[75] Inventors: Toru Otsubo, Fujisawa; Yasuhiro Yamaguchi, Chigasaki; Takahiko Takeuchi, deceased, late of Tokyo, all of Japan, by Kinichi Takeuchi, legal representative

[73] Assignee: Hitachi, Ltd., Tokyo, Japan

[21] Appl. No.: 110,368

[22] Filed: Oct. 20, 1987

[30] Foreign Application Priority Data

Oct. 20, 1986 [JP] Japan ................................. 61-247412
Mar. 25, 1987 [JP] Japan ................................. 61-68838
Apr. 22, 1987 [JP] Japan ................................. 62-97525
May 27, 1987 [JP] Japan ................................. 62-128158

[51] Int. Cl.$^4$ .................... B44C 1/22; C03C 15/00; B05D 3/06; C23C 14/00
[52] U.S. Cl. .................................... 156/345; 118/50.1; 118/623; 118/728; 156/643; 156/646; 204/298; 427/38
[58] Field of Search ............ 204/192.1, 192.12, 192.32, 204/192.35, 192.37, 298; 156/345, 643–646, 653, 657, 659.1, 662; 118/728, 50.1, 620, 623; 427/38, 39

[56] References Cited

U.S. PATENT DOCUMENTS 4,430,138 2/1984 Suzuki et al. ..................... 156/345
4,492,620 1/1985 Matsuo et al. .................. 204/298 X

FOREIGN PATENT DOCUMENTS 56-13480 2/1981 Japan .
56-96841 8/1981 Japan .

OTHER PUBLICATIONS

Handotai Kenkyu, No. 18, pp. 121–137 and 145–169, 1982.
H. Abe, Microwave Technique, pp. 71–74, 105–108 and 143–145.

Primary Examiner—William A. Powell
Attorney, Agent, or Firm—Antonelli, Terry & Wands

[57] ABSTRACT

Microwaves supplied from a magnetron through a waveguide are resonated in a cavity resonator to increase their amplitude. The resonated microwaves are emitted into a plasma production chamber through slits and a wall. Then plasma is produced in the plasma production chamber into which plasma processing gas is introduced. The plasma is employed for uniformly processing a substrate.

12 Claims, 13 Drawing Sheets

PLASMA PROCESSING APPARATUS

BACKGROUND OF THE INVENTION

This invention relates to fabrication of semiconductor devices using low temperature plasma, and more particularly to a plasma processing apparatus suited for carrying out the respective techniques of CVD, etching, sputtering, ashing, etc. at high speed.

Devices using low-temperature plasma roughly includes two categories consisting of one of applying a high frequency voltage at about 10 KHz to 30 MHz to one of parallel plate electrodes in vacuum to create plasma (see "HANDOTAI KENKYU" No. 18, pages 121–137, 145–169); and the other of introducing a microwave at 2.45 GHz into a vacuum chamber to create plasma. Conventionally, the device belonging to the former category has been mainly used.

On the other hand, the miniaturization of the semiconductor devices has caused a problem that the bombardment of ions which is generated in plasmaprocessing thereof disadvantageously influences the device performance. It has been also required to increase the processing speed in order to improve the processing capability.

In order to increase the processing speed, only increasing the density of plasma or the radical concentration thereof, which means the concentration of active paticles immediately before the ionization, is not sufficient. Specifically, the energy of ions plays an important role in dry etching using plasma and plasma CVD. In the case of dry etching, if the ion energy is too high, the underlying film will be cut or the crystal structure will be badly influenced, thus deteriorating the device performance. On the other hand, if the ion energy is too low, the polymer formed on the etched face will not be sufficiently removed, thus reducing the etching speed; or inversely a passivation film of the polymer will not be formed but the side of the pattern will be etched, thus reducing the dimension accuracy of the pattern.

Also in the plasma CVD, the magnitude of ion energy influences the quality of the formed film in such a way that low ion energy leads to coarse film composition while high ion energy leads to dense film composition.

Thus, it is indispensable for the future plasma processing to densify the plasma and also properly control the ion energy. Examples of such a plasma processing are the systems of producing plasma using microwaves such as disclosed in JP-A-56-13480 (U.S. Pat. No. 4,492,620), and JP-A-56-96841.

When plasma is to be produced using microwaves, only the emitting of the microwaves, which is generated by means of a magnetron, into a highly evacuated plasma production chamber cannot satisfactorily produce plasma. This is because the field strength of the microwaves generated is not so high that the electrons are not supplied with sufficient energy. Thus, in order to sufficiently produce the plasma using the microwaves, there have been proposed two techniques; one is to supply the electrons with energy in a cyclotron resonance condition occurring when the cyclotron frequency, which is the orbital motion frequency when electrons travel in the plane perpendicular to the magnetic field, and the frequency of the microwaves are made equal to each other, and the other is to supply the electrons with the energy with the electric field strength increased by emitting the microwaves into a cavity resonator to increase the amplitude of the microwaves. The former, which is generally referred to as an ECR (Electron Cyclotron Resonance) technique, is disclosed in the above JP-A-56-13480 and U.S. Pat. No. 4,492,620. The latter is disclosed in the above JP-A-56-96841.

In the case of the these techniques, the plasma generated through the microwaves includes the electrons directly supplied with energy from the microwaves so that the voltage across the sheath formed between the plasma and the substrate does not almost vary. Thus, by appropriating controlling the voltage across the sheath with the high frequency voltage being applied to the electrode on which a substrate is placed, it is possible to provide the plasma with the higher density and the ion energy properly controlled for the high speed processing.

Again, in the plasma processing the ion energy plays an important role. However, in the prior art ECR technique disclosed in the above JP-A-56-13480, when a high frequency voltage is applied to the electrode on which the substrate is placed, the high frequency current flows towards the surrounding processing chamber since the ground electrode is not arranged on the side opposite to the above electrode. Thus, the effect of ion energy on the substrate is greater on its periphery and is smaller on its center. Therefore, the entire substrate cannot be processed under a uniform condition.

In the prior art technique of using a cavity resonator such as disclosed in the above JP-A-56-96841, the plasma is produced in a cavity resonator so that when the plasma is produced, the wavelength of the microwaves is changed according to the plasma density. Thus, the resonance condition is not satisfied and accordingly the plasma will be unstable. More specifically, since the resonance condition is satisfied before the plasma is produced, the electric field strength of the microwaves becomes greater, thus eventually producing the plasma. However, when the plasma density of the plasma thus produced becomes higher, the wavelength of the microwave will be changed. Thus, the resonance condition will not be satisfied, thereby decreasing the electric field strength. Then, the electrons will be supplied with lower energy and so the plasma density will be decreased. Once the plasma density is decreased, the resonance condition will be satisfied again and the plasma density will be higher. Due to such a phenomenon, it is difficult to produce stabilized plasma using the cavity resonator.

Moreover, when the electrode for applying a high frequency voltage is arranged in the cavity resonator in order to control the energy of the ions incident to the substrate from the plasmas, the reflection of the microwave or the like will occur so that the plasma formed will be further unstable.

SUMMARY OF THE INVENTION

An object of this invention is to provide a plasma processing apparatus which is capable of producing stabilized and high density plasma and making uniform the energy of ions incident to a substrate over the entire substrate.

To attain this object, in accordance with this invention, there is provided a plasma processing apparatus comprising a microwave generation source, a waveguide for supplying the microwaves from the microwave generation source, a cavity resonator at an atmospheric pressure connected with the end of the waveguide to resonate the microwaves, a plasma production chamber, and a slit provided for relatively uniformly emitting the resonated microwaves into the plasma production chamber. One gist of this invention is that the waveguide is connected with the cavity resonator and the microwaves are supplied into the plasma production through the slit provided at the cavity resonator. In such a construction, when the microwaves propagate in the cavity resonator, the microwaves are resonated by the wall in the resonator and the like and also the current corresponding to the electromagnetic field generated flows in the interior surface. If the slit is provided at the boundary between the cavity resonator and the plasma production chamber so as to traverse the current, charges are accumulated at both ends of the slit. Since the amount of the charges accumulated is varied along with the propagation of the microwaves, the electric field at both ends of the slit is also varied. Thus, the microwaves are uniformly emitted from the cavity resonator into the plasma production chamber. In this way, when the waveguide is connected with the cavity resonator, the microwaves the amplitude of which has been increased through the resonance in the cavity resonator is emitted into the plasma production chamber through the slit the area of which is about one third times or one 10th times the sectional area of the resonator. Thus, even if the plasma production chamber is not formed in a cavity resonator structure unlike the prior art, high density plasma can be produced.

Therefore, the electrode structure according to this invention doesn't have any restriction relative to the cavity resonator. Moreover, since the plasma is not produced in the cavity resonator, the resonance state therein remains unchanged, and so the stabilized plasma can be produced. Further, the cavity resonator connected to ground can be used as an electrode opposite to and in parallel to the electrode on which the substrate is placed, as in the system of parallel plate electrodes so that the effect of ion energy can be uniformly made over the entire substrate.

Another gist of this invention is that a slit plate integral to the cavity resonator and having plural slit-like openings extended towards the plasma production chamber is provided and gas flow paths from a gas supply source to the plasma production chamber are provided among the plural openings. In such a structure, the gas flow paths are formed among the slit-like openings of the slit plate so as to open towards the plasma production chamber so that shower-like gas can be supplied into the plasma production chamber without obstructing the path for introducing the microwaves. Thus, high density plasma can be uniformly provided to the entire substrate.

Moreover, this invention is also characterized in that the slit is formed through a plating technique, that a high frequency power supply is connected between a conductive slit plate with slits and the electrode on which the substrate is placed, and that the application of the high frequency voltage is switched between the slit plate and the electrode.

DESCRIPTION OF THE PREFERRED EMBODIMENTS

Figure 1:
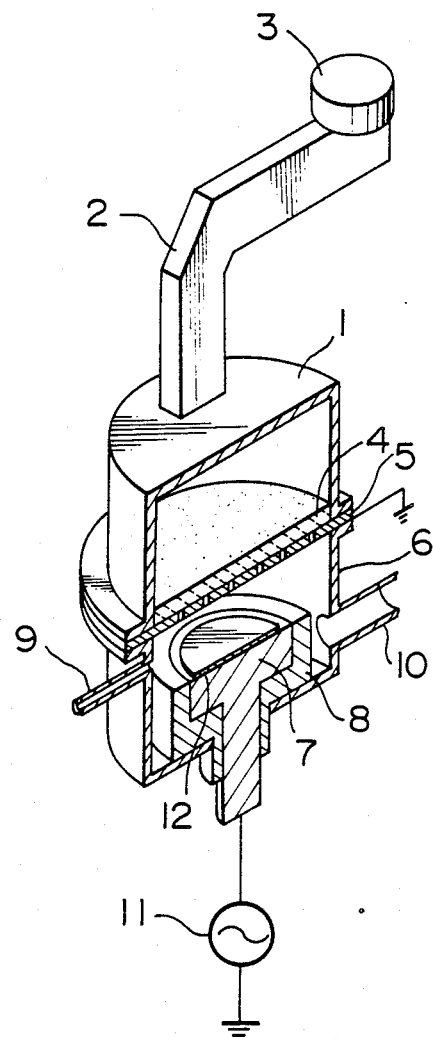
FIG. 1 is a perspective view of one embodiment according to this invention.

Now referring to FIG. 1, one embodiment of this invention will be explained. In FIG. 1, 1 is a circular cavity resonator in $E_{01}$ mode to which microwaves are supplied from a magnetron 3 through a waveguide 2. The waveguide 2 is eccentrically attached to the one side of the circular cavity resonator 1 so as to provide a desired coupling with the $E_{01}$ mode. On the other side of the circular cavity resonator 1 attached are a ceramic plate 4 and a slit plate 5 in order. The slit plate 5 is connected with a plasma production chamber 6. The plasma production chamber 6 is separated from a circular cavity resonator 1 by a plate made of microwave-transmitting materials such as ceramics or quartz. The circular cavity resonator 1 is at atmospheric pressure in its interior in which microwaves are reflected at the inner wall so as to be resonated. Therefore, the microwaves supplied through the waveguide 2 are resonated in the circular cavity resonator 1 so that they are increased in their amplitude and so energy.

Figure 2:
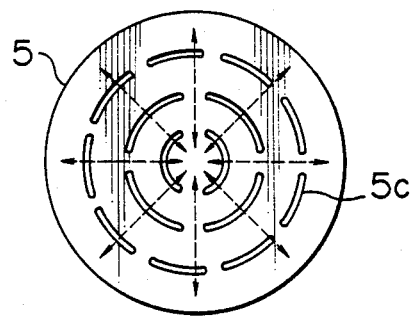
FIG. 2 is a plan view of one example of a slit employed in the embodiment of FIG. 1.

The planar structure of the slit plate 5 is shown by 5b in FIG. 2. As shown, the slit part 5b includes ring-shape slit openings (referred to as simply slits) in the direction perpendicular to the electric field in $E_{01}$ mode.

Figure 10:
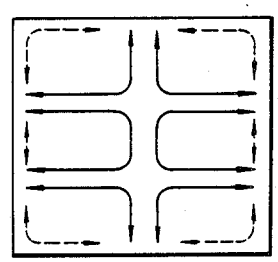
FIG. 10 shows the electric field distribution in the resonance in $E_{01}$ mode.

The resonance in the $E_{01}$ mode occurs in the electric field distribution as shown in FIG. 10. Then, the surface current as indicated by broken lines flows on the interior surface of the cavity resonator 1. The surface current on the bottom surface of the cavity resonator 1 flows from its center towards its periphery as shown in FIG. 2 that is indicated by broken lines. The slit plate 5 is located at the position corresponding to this bottom surface and so the slits 5c are provided in the direction perpendicular to the surface current. The charges due to the surface current are accumulated at both ends of each of the slits 5 so that the electric field is generated in the slit part 5. This electric field is varied at the frequency of 2.45 GHz so that the microwaves are emitted from the slits 5c. The length of the slits 5c is set at 60 mm, which corresponds to $\frac{1}{2}$ of the wavelength of the microwave (2.45 GHz), or more to satisfactorily emit the microwaves. The width of the slits 5c ranges preferably from 5 mm to 15 mm although it varies in accordance with the kind of processing gas. Moreover, in order that the microwaves can be emitted uniformly over the entire periphery of a substrate, many slits 5c are provided so as to occupy about one third - one 10th the entire area of the slit plate 5.

There are provided, in the plasma production chamber 6, an electrode 7 on which the substrate to be processed is placed, a gas supply tube 9 and a gas exhaust tube 10. The electrode is fixed to the plasma production chamber 6 by means of an insulator 8 and is connected with a high frequency power supply 11. (The plasma production chamber 6, the slit plate 5 and the cavity resonator 1, etc. are connected to ground.) The gas supply tube 9 is adapted to supply a predetermined amount of plasma processing gas from a gas source (not shown). The gas exhaust tube 10, which is connected with a vacuum evacuation pump, is adapted to control the pressure in the plasma production chamber in the range of 1 to $10^{-3}$ Torr.

In operation, the magnetron 3 is operated to oscillate the microwaves which are supplied to the circular cavity resonator 1 through the waveguide 2. The energy of the microwaves with the amplitude increased in the cavity resonator 1 is emitted into the plasma production chamber 6 through the slits 5c. Since the amplitude of the microwaves emitted into the plasma production chamber 6 has been increased in the cavity resonator 1, plasma is produced in the plasma production chamber 6 even if the plasma production chamber 6 is not in a cavity resonator structure.

Explanation will be given for the case where the device according to one embodiment of this invention is applied to etching. First, etching gas is supplied from the gas supply tube 9 into the plasma production chamber 6. With the plasma production chamber 6 evacuated to a prescribed pressure from the gas exhaust tube 10, the plasma due to the microwaves is produced between the slit plate 5 and the electrode 7. (Since the microwaves directly act on the electrons in the plasma, the potential difference between the plasma and the electrode 7 is in the level of 20 to 30V.) With the wafer (substrate) to be processed being placed on the electrode 7, a high frequency voltage is applied to the electrode 7 from the high frequency power supply 11. Since the electrode 7 and the slit plate 5 connected to ground are arranged in parallel to each other, a high frequency current uniformly flows between the electrode 7 and the slit plate 5 connected to ground. Thus, the electric field occurring between the electrode 7 and the plasma becomes uniform. Accordingly, with the high frequency voltage applied, the ions of etching gas is controlled so as to be incident to the wafer 12 with the uniform energy over the entire wafer surface. The ions in the etching gas and/or the radicals of the etching gas excited in the plasma act on the film to be processed on the wafer 12. In this way, the etching proceeds. Since the energy of the incident ions during the etching is uniform, the etching can be carried out uniformly over the entire wafer.

Explanation will be given for the case where the device according to the one embodiment of this invention is applied to plasm CVD. $SiH_4$ and mixed gas of $N_2$ and $N_2O$ are supplied from the gas supply tube 9. $N_2O$ and $SiH_4$ are decomposed by the produced plasma to create SiO, which is formed on the wafer as a film. The film quality is controlled by the incidence of the ions from the plasma. Since the incidence energy of the ions can be made uniform, the film can be formed uniformly on the entire wafer.

Figure 3:
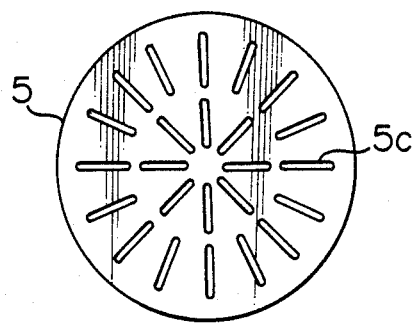
FIG. 3 is a plan view of an alternative example of the slit of FIG. 2.
Figure 4:
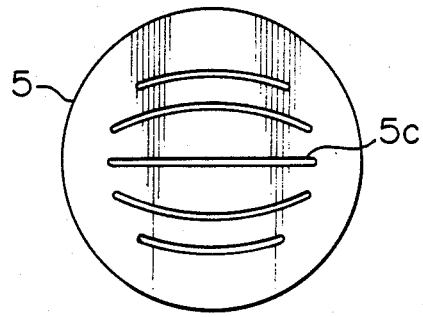
FIG. 4 is a plan view of another alternative example of the slit of FIG. 2.

Although in this embodiment, the resonance mode in the circular cavity resonator 1 was the $E_{01}$ mode, any other suitable modes can be used. However, the emission efficiency is higher when the slits are in the direction pependicular to the current flowing in the cavity resonator surface. Thus, the slit plate preferably has the structure as shown in FIG. 3 in the case of $H_{01}$ mode and the structure as shown in FIG. 4, in the case of $H_{11}$ mode. (Refer to "Microwave Technique" by H. Abe, Tokyo Univ. pp. 71-74, 105-108, 143-145.)

As described above, in accordance with the one embodiment of this invention, the effect of ion energy indispensable to the plasma processing can be made uniform and also stabilized plasma can be produced.

Figure 5:
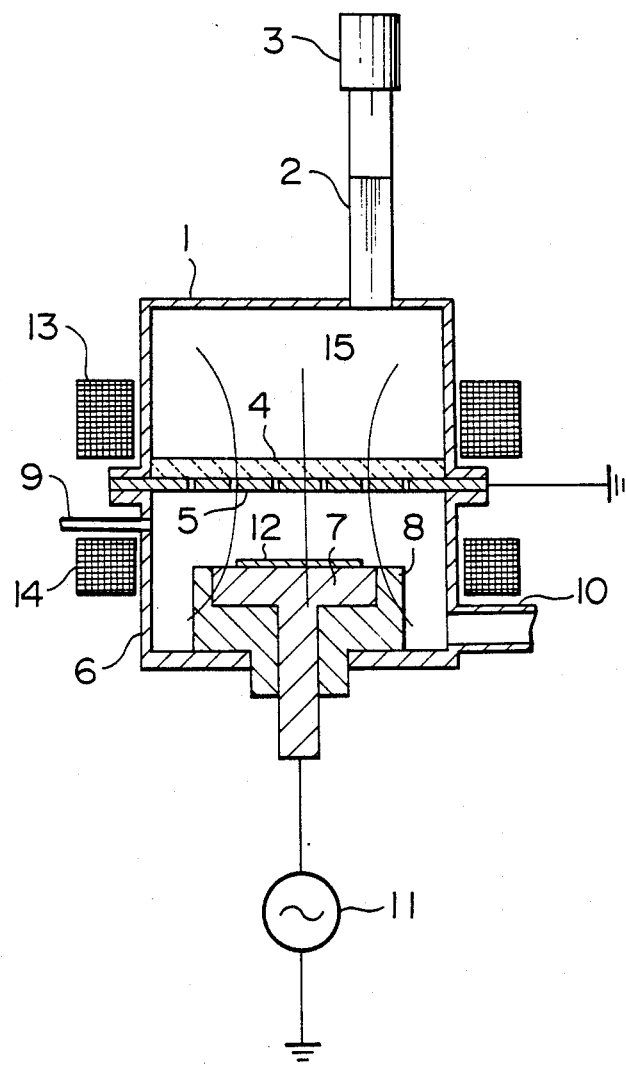
FIG. 5 is a perspective view of another embodiment according to this invention.

Meanwhile, in the embodiment of FIG. 1, the microwaves are only emitted into the plasma production chamber. Therefore, when the density of the produced plasma exceeds $10^{11} cm^{-3}$, the microwaves are reflected and the plasma density cannot be further enhanced. Thus, if the plasma density greater than $10^{11} cm^{-3}$, a magnetic field 15 which is in parallel to the emitting direction of the microwaves is provided by coils 13 and 14 as shown in FIG. 5.

In this embodiment, since the amplitude of the microwaves is increased in the cavity resonator 1, the state of electron cyclotron resonance is not required, but the magnetic field strength in accordance with the required plasma density can be selected. Moreover, since the amplitude of the microwaves can be made greater than the prior art resonance system, stabilized plasma discharge can be produced in the region evacuated to a higher degree.

Figure 6:
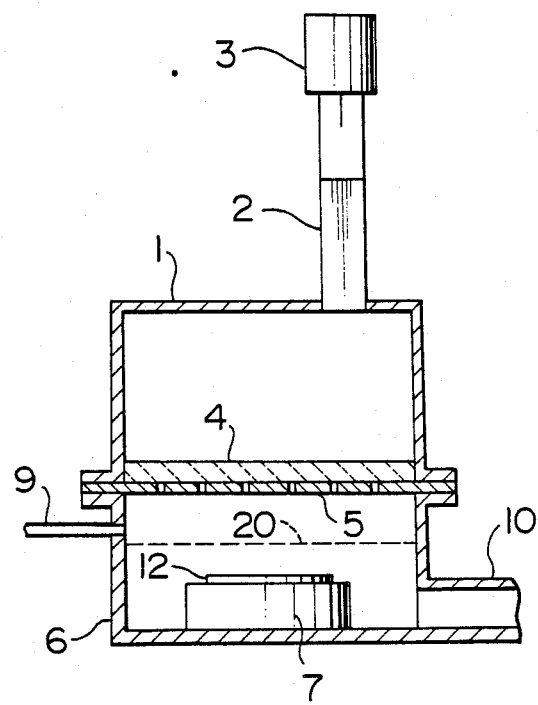
FIG. 6 is a sectional view of the arrangement when this invention is applied to an ashing device.

An embodiment in which this invention is applied to an ashing processing will be explained with reference to FIG. 6. Only different matters from the embodiment of FIG. 1 will be explained since the parts indicated by the same reference numbers in FIGS. 1 and 6 perform the same operations.

A mesh plate 20 is located in the interior of the plasma production (processing) chamber 6 and a wafer 12 is placed on a table 7 which is also provided in the chamber 6.

Oxygen gas is supplied from the gas supply tube 9. The magnetron 3 is operated to supply microwaves thereby to produce plasma between the slit plate 5 and the mesh plate 20.

Since the mesh plate 20 is dimensioned so as not to transmit the microwaves, the plasma is confined between the mesh plate 20 and the slit plate 5. The oxygen gas which has been placed in the radical state due to the plasm is supplied onto the wafer 12 through the mesh plate 20. The oxygen radicals ashing-process the resist film on the wafer.

In the embodiments mentioned above, a combination of a circular cavity resonator and a slit plate has been employed but this invention is not limited to it.

Figure 7:
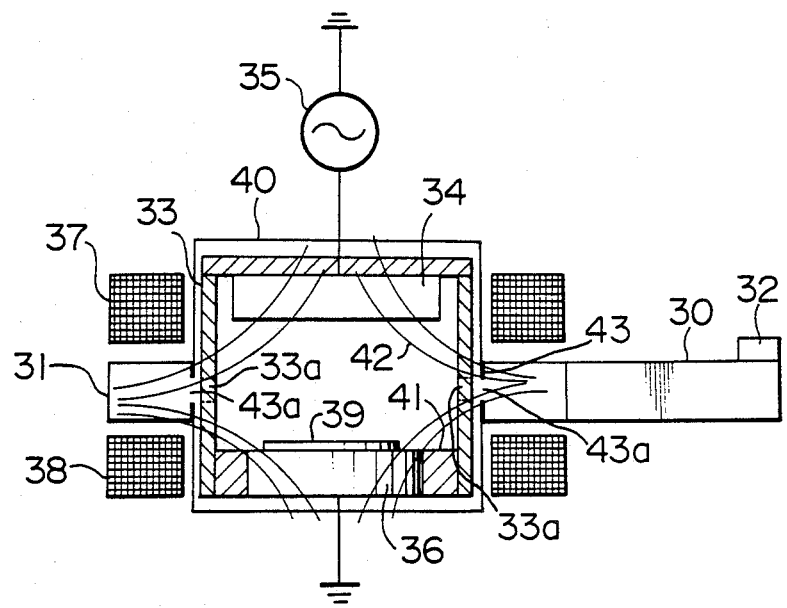
FIG. 7 is a sectional view of the arrangement when this invention is applied to a sputtering device.

Another embodiment in which this invention is applied to a sputtering device will be explained with reference to FIG. 7. A processing chamber 33 made of ceramics or quartz is adapted to control the pressure therein in the range of $10^{-4}$ Torr to $10^{-2}$ Torr by means of a gas supply tube and a gas exhaust tube.

A target 34 and a wafer table 36 are placed in the processing chamber 33. The target 34 is connected with a high frequency power supply 35, and the wafer table 36 is connected to ground. A shield chamber 40 and a square-ring shape resonator 31 are provided on the exterior of the processing chamber 33.

The square-ring shape resonator 31 is provided by forming a square waveguide in a ring-shape with the route length of the ring being integer times $\frac{1}{2}$ of the wavelength in the waveguide. The ring-shaped waveguide is provided with a terminating wall so as to preventing the phase of the resonating microwaves from being shifted.

Figure 8:
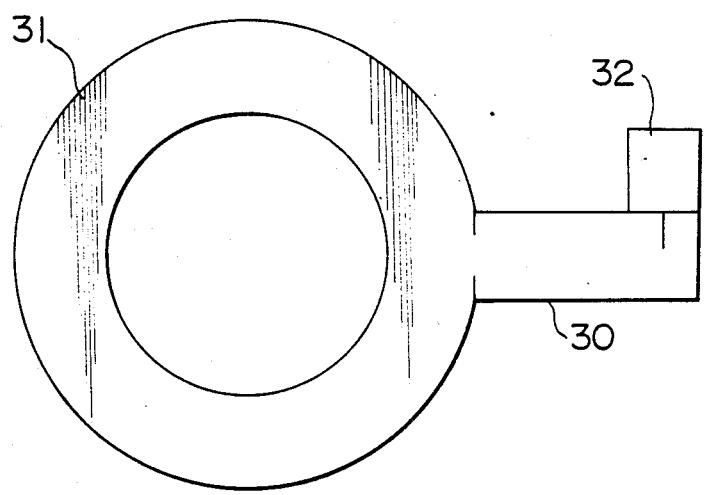
FIG. 8 is a plan view of a resonator employed in the sputtering device of FIG. 7.

The planar structure of the ring-shaped resonator 31 is shown in FIG. 8. The resonator 31 is supplied with microwaves from a magnetron 32 through a waveguide 30. The shield chamber 40 (FIG. 7) is in its exterior, provided with ocils 37 and 38 so as to generate a cusped magnetic field 42, which is more concretely disclosed in U.S. Pat. No. 76,905 filed on Aug. 23, 1985 and EPC Appln. No. 85110155.0 filed on Aug. 13, 1985. The shield chamber 40 is made of stainless steel which does not outwardly transmit microwaves but transmit the magnetic field.

The ring-shaped resonator 31 is, in its interior, provided with a slit means 43 in which a slit 43a is formed in the entire periphery. When microwaves are supplied into the ring-shaped resonator, the amplitude of the microwaves is increased in the resonator and the microwaves with the increased amplitude are emitted into the processing chamber 33 through the slit 43.

When the pressure in the processing chamber 33 into which argon gas has been introduced is maintained at $10^{-3}$ Torr, the plasma confined in the cusped magnetic field 42 is produced between the target 34 and the wafer table 36. Next, with the high frequency voltage applied to the target 40 from the high frequency power supply 35, ions of argon gas are directed to the target, thus sputtering the target material so as to form a film on the wafer 39. In this embodiment also, as in the embodiment of FIG. 5, the microwaves with the increased amplitude permit stabilized plasma to be produced under the condition of high vacuum degree, thus improving the film quality.

The system using such a combination of the ring-shaped resonator and the slit can also be applied to etching and plasma CVD as well as sputtering.

Figure 9:
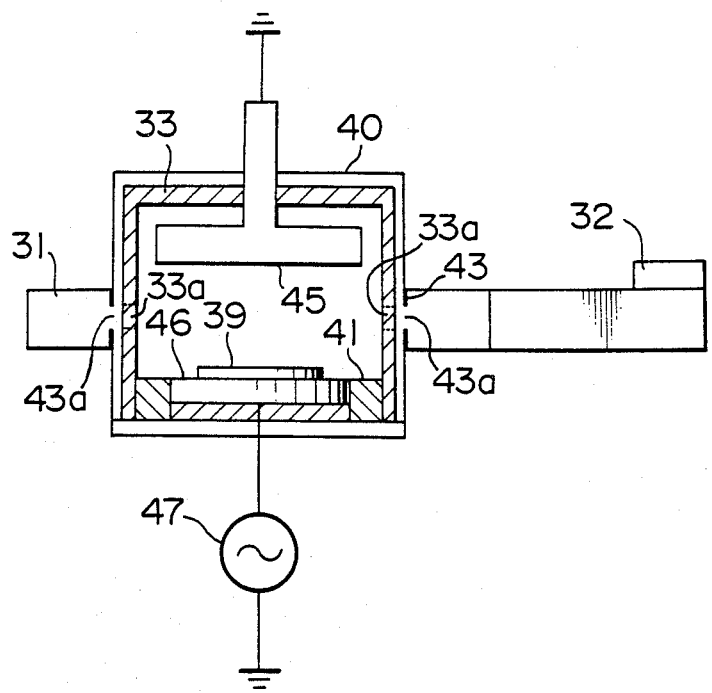
FIG. 9 is a sectional view of one embodiment when this invention is applied to an etching device or CVD device.

Thus, an embodiment in which this combination is applied to etching will be explained with reference to FIG. 9. Since the basic construction thereof is the same as the sputtering device of FIG. 7, only the difference therefrom will be explained.

A lower electrode 46 and an upper electrode 45 are located in the processing chamber 33. The lower electrode 46, fixed to the processing chamber 33 through the insulator 41, is so adapted that a high frequency voltage is applied thereto from the high frequency power supply 47. The upper electrode 45 is connected to ground.

In operation, etching gas is introduced into the processing chamber 33 and the pressure therein is maintained at $10^{-2}$ Torr. In this state, microwaves are supplied into the ring-shaped resonator 31. Then, the microwaves are amplified in their amplitude and emitted into the processing chamber 33 through the slit 43. Thus, the plasma due to the microwaves is produced between the upper electrode 45 and the lower electrode 46 in the processing chamber 33.

In this state, when the high frequency voltage is applied to the lower electrode 46, a high frequency current flows uniformly between the parallel plate electrodes and also the ions of the etching gas incident to the wafer are accelerated by the uniform potential difference across the sheath, thus providing uniform etch-processing property to the entire wafer surface. As shown in FIGS. 7-9, the chamber 33 is entirely made of ceramics or quartz. However, it is not necessarily to do so, but it may be constituted so that electrodes 34 and 36, or 45 and 46 are isolated from the shield chamber 40 and a part 33a to which microwaves are introduced isolates the processing chamber 33 from the ring-shaped resonator 31.

As described above, in accordance with this embodiment of this invention, in producing plasma using microwaves in the plasma processing chamber, another electrode can be located oppositely to the one electrode on which the wafer is placed. This enables uniform plasma processing to the wafer. Moreover, since the plasma processing chamber need not be made in a cavity resonator structure, the electrodes and the plasma production chamber don't have any limitation to their structure. Further, in accordance with this invention, stabilized plasma can be produced using microwaves.

In accordance with this invention, the plasma processing device doesn't have any limitation to its structure in relation to the cavity resonator. Then, the cavity resonator, connected to ground, can be employed as an opposite electrode in parallel to the electrode on which an object to be processed is placed. Thus, since energy of the microwaves can be propagated through the slit attached to the opposite electrode, the effect of the ions and/or radicals created by the energy can be uniformly given to the object.

Further, the plasma processing can be carried out with optimum ion energy at high speed process, some miniature patterns of a semiconductor wafer can be made with high accuracy, at high speed process and with less damage; and a uniform film can be formed at high speed process.

Figure 12:
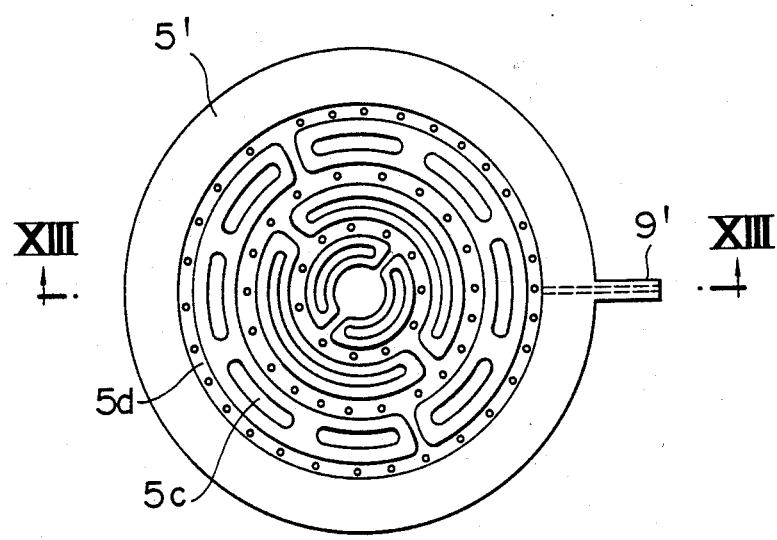
FIG. 12 is a plan view of a slit plate employed in the embodiment of FIG. 11.
Figure 13:
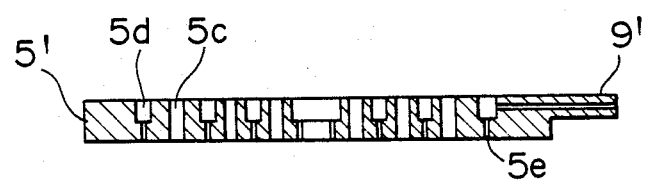
FIG. 13 is a sectional view taken on line A—A' of FIG. 12.

Now referring to FIGS. 11 to 16, a still another embodiment of this invention will be explained. In these drawings, components 1 to 4, 6 to 8, 10 and 11 are the same as those shown in FIG. 1 in their structure and function but a slit plate 5' and a gas supply tube 9' are different from the corresponding components in FIG. 1. More specifically, as shown in FIGS. 12 and 13, the slit plate 5' is, among the plural slits 5c, provided with a continuous concentrical groove 5d and a great number of pores 5e which open from the groove 5d into the plasma production chamber 6. Thus, as seen from FIGS. 11, 12 and 13, if the slit plate 5' and the ceramic plate 4 are stacked in intimate contact to each other, gas flow paths communicating the gas supply tube 9' with the plasma production chamber 6 are formed between the slit plate 5' and the ceramic plate 4 by means of the groove 5d and the pores 5e. These gas flow paths serve to jet the gas from the gas supply tube 9' in a shower-like manner towards the substrate placed on the electrode 7 in the plasma production chamber 6.

The gas exhaust tube 10, connected with a vacuum evacuation pump (not shown), is adapted to control the pressure in the plasma production chamber 6 at 1 to $10^{-3}$ Torr.

Explanation will be given for the cases where this embodiment of this invention is applied to etching and plasma CVD.

First, the magnetron 3 is operated to oscillate microwaves which are supplied into the cavity resonator through the waveguide 2. The microwaves are increased in their amplitude in the cavity resonator 1, and the microwaves is emitted into the plasma production chamber 6 through the slits 5c. Since the amplitude of the microwaves has been increased in the cavity resonator 1, plasma is produced and maintained in the plasma production chamber 6 even if the chamber is not made in a cavity resonator structure.

In this state, etching is carried out as follows. First, etching gas is supplied from the gas supply tube 9' into the plasma production chamber 6. With the plasma production chamber evacuated to a prescribed pressure from the gas exhaust tube 10, the plasma due to the microwaves is produced between the slit plate 5' and the electrode 7. (Since the microwaves directly act on the electrons in the plasma, the potential difference between the plasma and the electrode 7 is in the level of 20 to 30V.)

Thereafter, with the wafer to be processed being placed on the electrode 7, a high frequency voltage is applied to the electrode 7 from the high frequency power supply 11. Since the electrode 7 and the slit plate 5' connected to ground are arranged in parallel to each other, a high frequency current uniformly flows between the electrode 7 and the slit plate 5' connected to ground. Thus, the electric field occurring between the electrode 7 and the plasma becomes uniform. Accordingly, with the high frequency voltage applied, the ions of etching gas is controlled so as to be incident to the wafer with the uniform energy over the entire wafer surface. The ions in the etching gas and/or the radicals of the etching gas excited in the plasma act on the film to be processed on the wafer 12. In this way, the etching proceeds. Since the energy of the incident ions during the etching and also the gas flow are uniform, the etching can be carried out uniformly over the entire wafer 12.

Plasma CVD is carried out as follows. SiH$_4$ and mixed gas of N$_2$ and N$_2$O are supplied from the gas supply tube 9'. N$_2$O and SiH$_4$ are decomposed by the produced plasma to create SiO, which is formed on the wafer 12 as a film. The film quality is controlled by the incidence of the ions from the plasma. Since the incidence energy of the ions can be made uniform, the film can be formed uniformly on the entire wafer surface. Incidentally, the slits in the slit plate 5' may be formed as shown in FIGS. 2, 3 and 4 in accordance with the resonance modes of $E_{01}$, $H_{01}$ and $H_{11}$, respectively.

Alternative examples of the gas flow paths in the embodiment of FIGS. 11 to 13 will be explained with reference to FIGS. 14 to 16.

Figure 14:
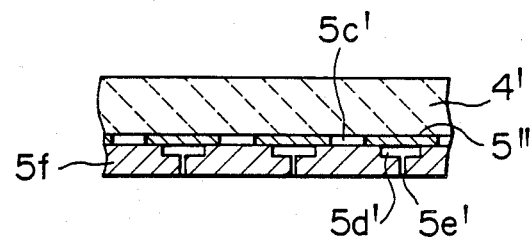
FIGS. 14 to 16 show sectional views of several example of a gas blow-out slit.
Figure 15:
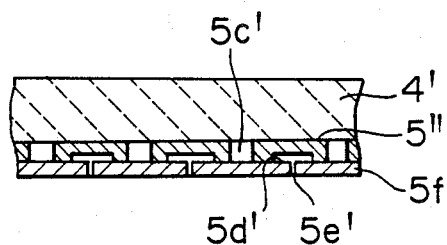

In the examples shown in FIGS. 14 and 15, a slit plate 5" is sandwitched between the ceramic plate 4' and a gas jet plate 5f. The gas jet plate 5f is made of alumina ceramic, quartz, etc. which can transmit microwaves. In FIG. 14, a groove 5d' and pores 5e' which form gas flow paths are formed in the gas jet plate 5f while in FIG. 5, the groove 5d' are the pores, 5d' are individually in the slit plate 5" and the gas jet plate 5f.

Figure 16:
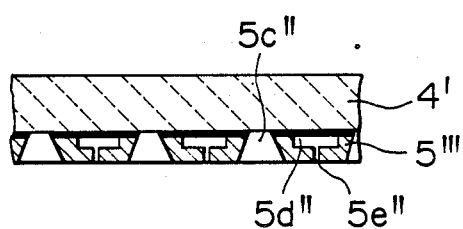

In FIG. 16 in which the gas jet plate 5f is not used, in order to facilitate the emission of microwaves the slit plate 5" is provided with tapered slits 5c".

Incidentally, the ceramic plate 4' is not limited to ceramic but can be made of any material which can transmit microwaves.

In accordance with this embodiment of this invention, in producing plasma using microwaves in the plasma processing chamber, another electrode can be located oppositely to the one electrode on which the wafer is placed, and the gas can be uniformly directed to the wafer in a shower-like manner. This enables uniform plasma processing to the wafer. Moreover, since the plasma processing chamber need not be made in a cavity resonator structure, the electrodes and the plasma production chamber don't have any limitation to their structure.

Further, since energy of the resonated microwaves can be propagated through the slit 5c' and 5c", and the gas can be uniformly directed to the wafer, the effect of the ions and/or radicals created by the energy if microwave can be uniformly given to the object to be processed.

Moreover, since the effect of the ions and/or radicals can be uniformly made, the plasma processing can be carried out optimum ion energy and at high speed process; some miniature patterns of a semiconductor wafer can be made with high accuracy, at high speed process and with less damage; and a uniform film can be formed at high speed.

Some changes or modification in the embodiments of this invention mentioned above will be explained below.

Figure 17:
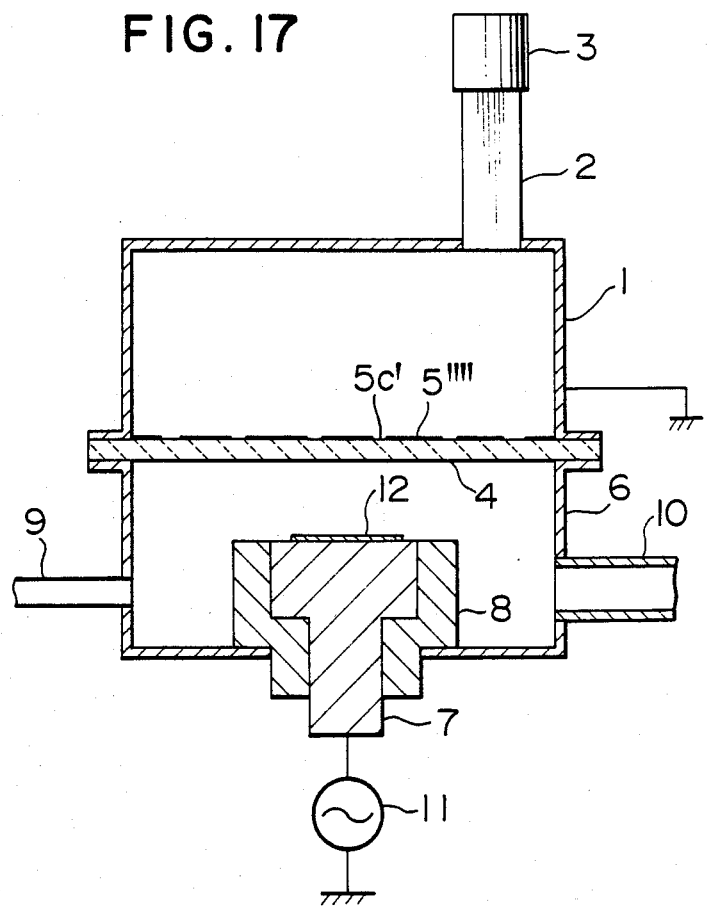
FIG. 17 is a sectional view of the plasma processing device of FIG. 11 in which the slit formed through a plating technique is provided on the side of the cavity resonator.

As shown in FIG. 17, the slits 5c can be formed by plating the ceramic plate 4 with a gold coating 5''''. The gold coating 5'''' may be deposited on the side of the cavity resonator 1 with respect to the ceramic plate 4. In this case, the pollution of the supplied gas due to the coating material does not occur since the coating 5'''' is not exposed to the gas atmosphere.

Figure 11:
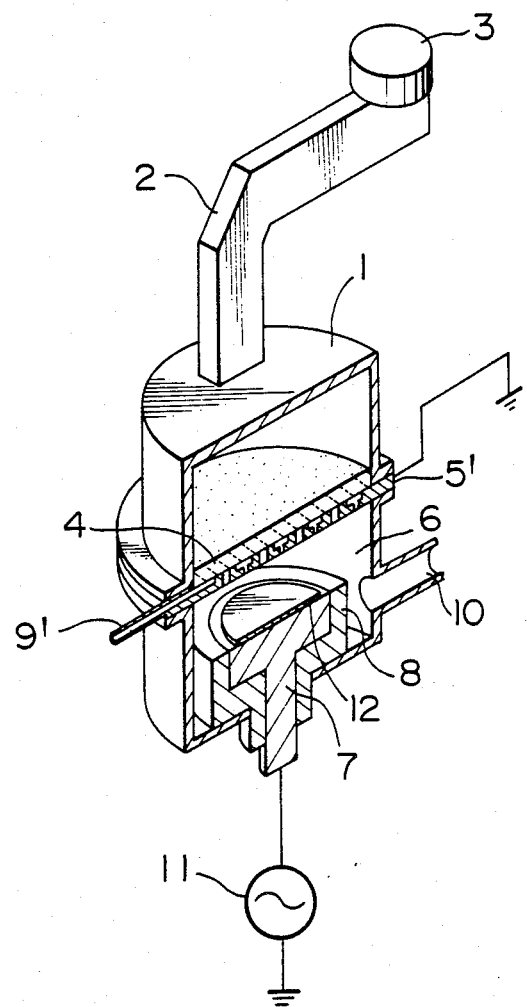
FIG. 11 is a perspective view of the plasma processing device according to still another embodiment of this invention.
Figure 18:
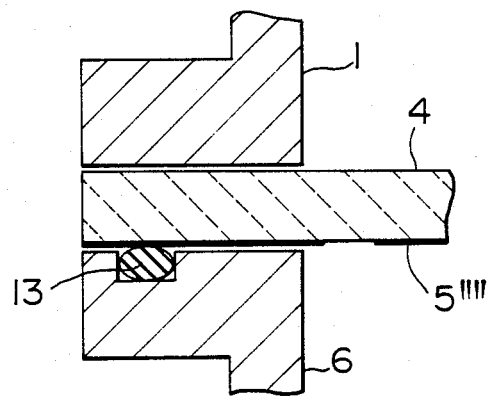
FIG. 18 is a sectional view of the vacuum sealing portion of the slit which is formed by the plating technique and provided on the plasma production chamber.

The ceramic plate 4 in the plasma processing device of FIG. 11 may be vacuum-sealed as shown in FIG. 18. More specifically, an O-ring 13 is sandwitched between the ceramic plate 4 and the plasma production chamber 6 to vacuum-sealed the ceramic plate 4. The ceramic plate 4 is provided with slits formed by the gold coating 5'''' and the O-ring selaed surface of the ceramic plate 4 is also plated with gold. Thus, the O-ring is surrounded by conductor of the gold coating 5''' and the plasma production chamber 6 and so microwaves don't invade the O-ring. Therefore, the O-ring 13 is not disadvantageously heated by the microwaves.

Figure 19:
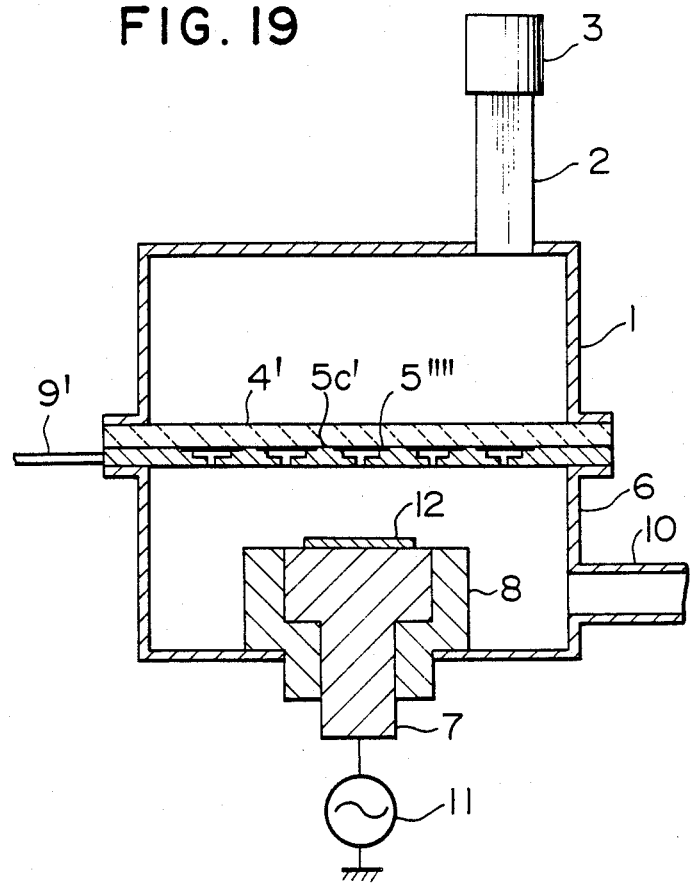
FIG. 19 is a sectional view of the slit in FIG. 14 which is formed through the plating technique.
Figure 20:
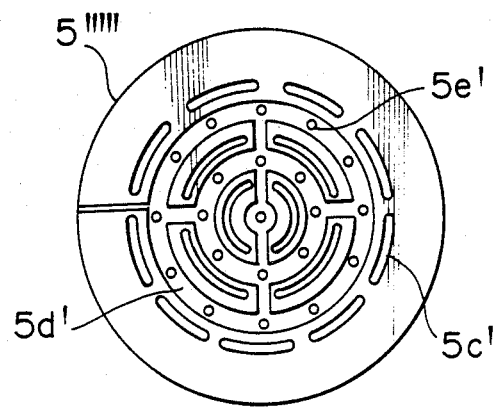
FIG. 20 is a plan view of the ceramic plate of FIG. 19.
Figure 21:
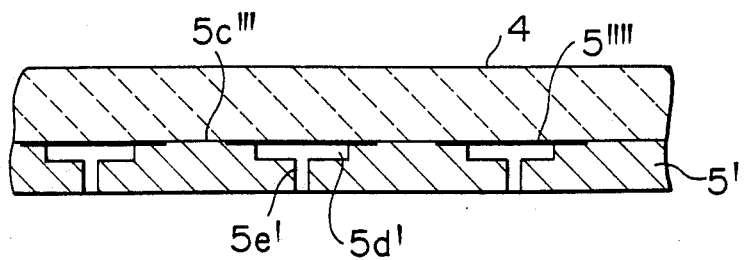
FIG. 21 is a sectional view of the ceramic plate of FIG. 19.

The slits shown in FIG. 14 can be formed by the gold (or the like conductor) coating 5'''' on the ceramic plate 4' in such a manner as shown in FIGS. 19 to 21. Specifically, as seen from FIG. 20, the lower ceramic plate 5''''' is provided with the continuous gas flow groove 5d' which are succeeded by the circular gas jet pores 5e' having a diameter of about 1 mm. The gas supplied to the ceramic plate 5' is supplied into the plasma production chamber 6 through the gas flow paths the groove 5d' and the pores 5e'.

As seen from FIG. 21 the upper ceramic plate 4 is, on its lower surface, provided with a slit pattern formed through gold plating (The slits 5c' are not plated). As shown in FIG. 21, the slit pattern covers the gas flow groove 5d' of the slit plate 5' so that the microwaves don't invade the groove 5d'. Thus, plasma is not created in the grooves 5d' and the supplied gas is not advantageously decomposed there.

Although in the above modification, the slits have been formed by plating the ceramic plate with conductor, these slits may be formed by applying the conductor to the ceramic plate 4 or bonding conductor foil thereto.

Further, although gold has been used as the conductor, any conductive any material can be employed. In the case where the slits are formed on the side of the plasma producton chamber with respect to the ceramic plate, the slit plate may be preferably made of noble metal such as gold, silver, platinum, etc.

Figure 22:
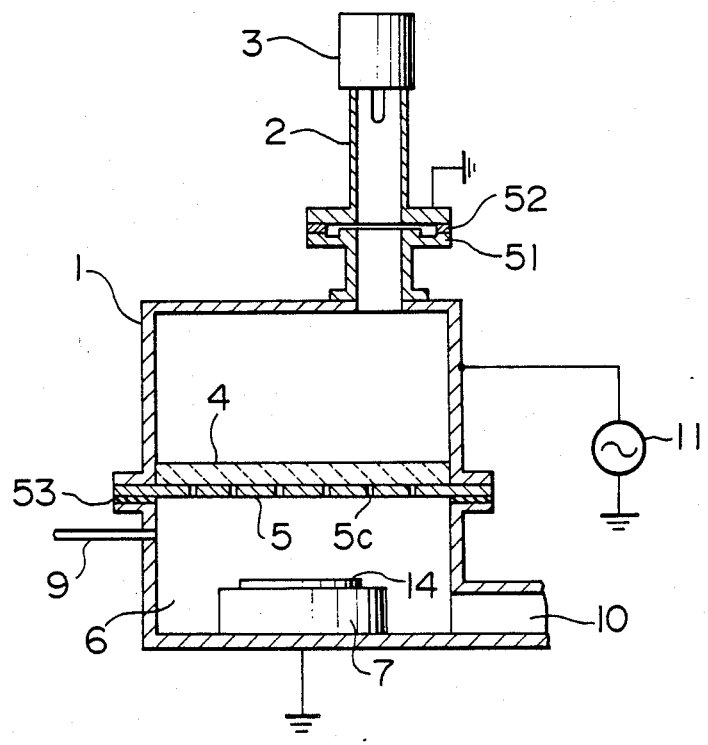
FIG. 22 is a sectional view of the plasma processing device according to a further embodiment of this invention.

Still another embodiment of this invention will be explained with reference to FIG. 22. In FIG. 22, microwaves are supplied from the magnetron 3 to the cavity resonator 1 in $E_{01}$ resonance mode through the waveguide 2. The waveguide 2 is provided with a choke frange 51 and an insulator 52 which are inserted on the way of the waveguide. The waveguide is eccentrically attached to the one side of the cavity resonator 1 so as to provide a desired coupling with the $E_{01}$ mode. On the other side of the cavity resonator 1 attached are in order the ceramic plate 4 and the slit plate 5 having the slits 5c. The slit plate 5 is, in the lower side, connected with the plasma production chamber 6 by means of an insulator 53. Incidentally, the ceramic plate 4 serves to vacuum-seal the plasma production chamber 6, so that the cavity resonator 1 may be floating and the high frequency power supply 11 may be connected with the cavity resonator 1. Furthermore leakage of microwaves from the waveguide may be prevented.

Figure 23:
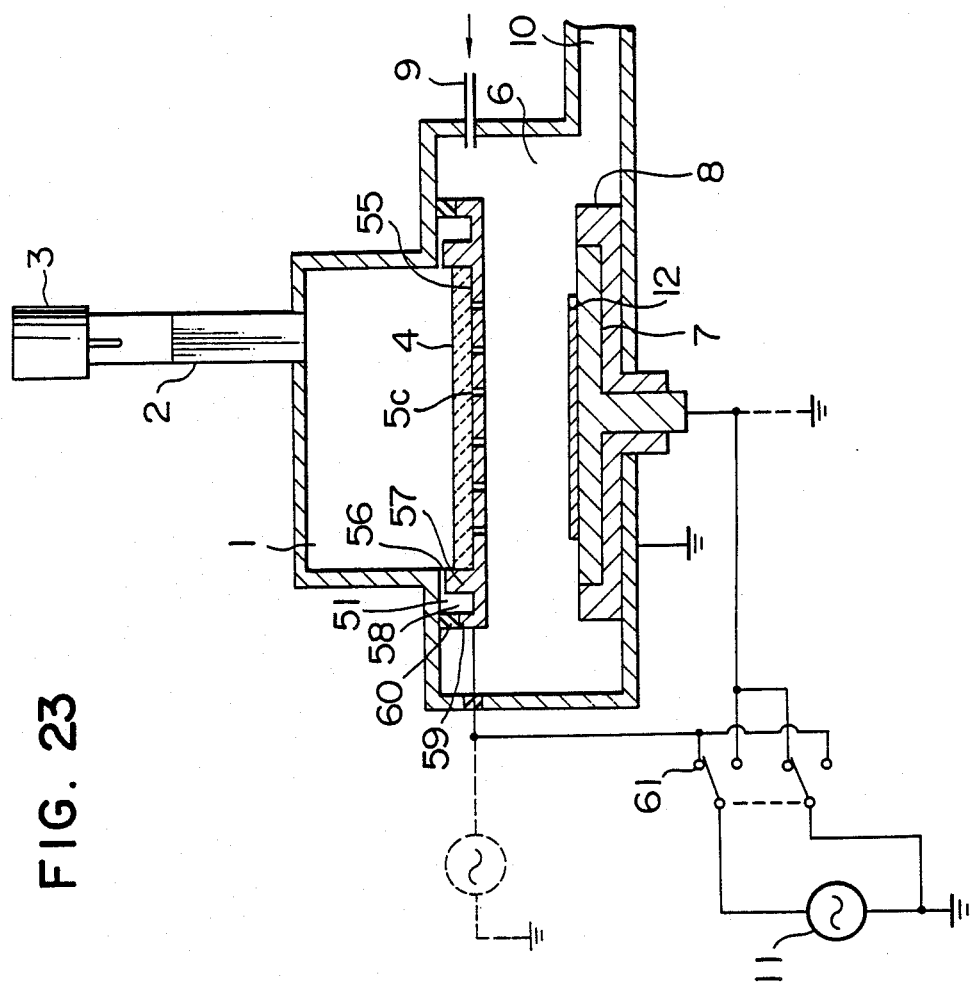
FIG. 23 is a sectional view of a modification of the plasma processing device of FIG. 22.

A further embodiment of this invention will be explained with reference to FIG. 23. As shown in FIG. 23, a slit plate 55 is provided with the slits 5c located oppositely to the substrate 12. The slit plate 55 is, in its periphery, also provided with an inside convex portion 57 and an outside convex portion 59 which are separated from each other by an interval 58. The inside convex portion 57 provides a small gap 56 between its tip and the cavity resonator 1. The small gap 56 and the interval 58 integral therewith constitute a choke frange 51. A ring-shaped insulator 60 is inserted between the tip of the outside convex portion 59 and the cavity resonator 1, so that the cavity resonator 1 may be floating and the high frequency power supply 11 may be connected with the cavity resonator 1. Further more, leakage of microwaves from the waveguide may be prevented. The high frequency power supply 11 applies a high frequency voltage to the electrode 7 on which a subtract is placed and the slit plate 55.

The arrangement according to this embodiment can perform the cleaning of the slit plate 55 and the electrode 7 in addition to the plasma processing. More specifically, processing gas of $CF_4$ is introduced from the gas supply tube 9 into the plasma production chamber 6. When a high frequency voltage is applied from the high frequency power supply 11 to the slit plate 55 by the switch 61, the energy of the ions from the plasma is increased, thereby cleaning the slit plate 55 at high speed. Similarly, when the high frequency voltage is applied to the electrode 7, the electrode can be plasma-cleaned. High frequency power supplies may be provided individually for the slit plate 55 and the electrode as shown by dotted lines.

We claim:

1. A plasma processing apparatus comprising:
   a microwave generation source;
   a waveguide for supplying the microwaves from the microwave generation source;
   a cavity resonator for resonating the microwaves supplied from the waveguide to increase the amplitude thereof;
   a slit means having at least one slit provided on a wall of the cavity resonator which can transmit the microwaves; and
   a plasma producing chamber in which plasma is produced by the microwaves introduced through the at least one slit and the wall separating the plasma producing chamber from said cavity resonator and by externally introduced processing gas, and a substrate is processed by the plasma.

2. A plasma processing apparatus according to claim 1, wherein said cavity resonator is formed in the shape of a cylinder and said slit means is provided in form of slit plate on the bottom face so as to be one wall of the plasma producting chamber.

3. A plasma processing apparatus according to claim 1, wherein said plasma producing chamber is provided with means for generating a magnetic field for increasing the plasma density.

4. A plasma processing apparatus according to claim 1, wherein said plasma producing chamber is, in its interior, provided with a grid plate facing the substrate for shielding the ions in the plasma.

5. A plasma processing apparatus according to claim 1, wherein electrodes opposite to each other are arranged on the upper and lower sides in said plasma producting chamber, said cavity resonator is a ring-shaped resonator provided around the ring side wall of the plasma producing chamber and said slit means is a ring-shaped slit attached to the side wall inside the resonator.

6. A plasma processing apparatus according to claim 1, wherein said wall is made of a ceramic-substrate or a quartz substrate.

7. A plasma processing apparatus according to claim 1, wherein said wall is provided with gas supply holes for supplying the processing gas from its portions where the slits are not located into the plasma producing chamber, the gas supply holes being connected with gas supply means.

8. A plasma processing apparatus according to claim 1, wherein said slit means is formed by plating onto the wall.

9. A plasma processing apparatus according to claim 8, wherein said slits means is provided on the side of the cavity resonator with respect to said wall.

10. A plasma processing apparatus according to claim 1, wherein an electrode on which the substrate is placed is arranged in the plasma producing chamber, and a high frequency power supply is connected between the slit means and the electrode on which the substrate is placed.

11. A plasma processing apparatus according to claim 10, wherein a switch for switching the high frequency power supply between the slit means and the electrode on which the substrate is placed is provided.

12. A plasma processing apparatus according to claim 5, wherein further comprising means for forming a casp magnetic field on the electrodes.

* * * * *